United States Patent
Han et al.

(10) Patent No.: US 10,431,613 B2
(45) Date of Patent: Oct. 1, 2019

(54) IMAGE SENSOR COMPRISING NANOANTENNA

(71) Applicant: SAMSUNG ELECTRONICS CO., LTD., Suwon-si (KR)

(72) Inventors: Seunghoon Han, Seoul (KR); Yibing Michelle Wang, Pasadena, CA (US)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 15/816,122

(22) Filed: Nov. 17, 2017

(65) Prior Publication Data
US 2018/0190688 A1 Jul. 5, 2018

(30) Foreign Application Priority Data
Jan. 3, 2017 (KR) .................. 10-2017-0000792

(51) Int. Cl.
*H01L 27/146* (2006.01)
*H01L 31/103* (2006.01)
*H01L 31/105* (2006.01)

(52) U.S. Cl.
CPC ...... *H01L 27/1461* (2013.01); *H01L 27/1463* (2013.01); *H01L 27/14612* (2013.01); *H01L 27/14643* (2013.01); *H01L 31/103* (2013.01); *H01L 31/105* (2013.01)

(58) Field of Classification Search
None
See application file for complete search history.

(56) References Cited

U.S. PATENT DOCUMENTS

| | | | |
|---|---|---|---|
| 8,450,728 B2 | 5/2013 | Yamaguchi | |
| 2011/0079704 A1 | 4/2011 | Yu et al. | |
| 2011/0156104 A1* | 6/2011 | Yamaguchi | H01L 27/14603 257/222 |
| 2016/0050376 A1 | 2/2016 | Fridental | |
| 2016/0056198 A1* | 2/2016 | Lee | H01L 27/14612 257/225 |
| 2016/0071894 A1* | 3/2016 | Lee | H01L 27/14621 348/222.1 |
| 2016/0112614 A1 | 4/2016 | Masuda et al. | |
| 2016/0156883 A1 | 6/2016 | Han et al. | |
| 2016/0172396 A1* | 6/2016 | Masuda | H01L 27/14614 257/252 |

FOREIGN PATENT DOCUMENTS

| | | |
|---|---|---|
| JP | 2011-138927 A | 7/2011 |
| JP | 2015-29054 A | 2/2015 |

* cited by examiner

Primary Examiner — Fazli Erdem
Assistant Examiner — Scott R Wilson
(74) Attorney, Agent, or Firm — Sughrue Mion, PLLC

(57) ABSTRACT

An image sensor includes a plurality of nanoantennas that satisfy sub-wavelength conditions. Each of the nanoantennas includes a diode and a transistor. Each diode is either a PN diode or a PIN diode.

20 Claims, 6 Drawing Sheets

IMAGE SENSOR COMPRISING NANOANTENNA

CROSS-REFERENCE TO RELATED APPLICATION

This application claims priority from Korean Patent Application No. 10-2017-0000792, filed on Jan. 3, 2017, in the Korean Intellectual Property Office, the disclosure of which is incorporated herein by reference in its entirety.

BACKGROUND

1. Field

Exemplary embodiments relate to an image sensor that includes nanoantennas.

2. Description of the Related Art

An image sensor that captures an image of a subject and converts the image into electrical signals has been used in electronic devices for general customers, e.g., digital cameras, cameras for mobile phones, portable camcorders, etc., as well as cameras mounted on vehicles, security devices, or robots. Such an image sensor may include a pixel array in which unit pixels respectively include photodiodes. The photodiodes may generate electrical signals which correspond to the intensity of absorbed light. For example, the photodiodes may absorb light and thus generate currents.

Since image sensors are employed in external devices such as mobile phones, digital cameras, and display devices, the image sensors must be miniaturized. When the image sensors decrease in size, corresponding sizes of photodiodes and circuits, which control currents emitted from the photodiodes, must also be reduced. Therefore, there is a need to develop an architecture regarding miniaturization of image sensors.

SUMMARY

Provided is an image sensor that includes nanoantennas.

Additional aspects will be set forth in part in the description which follows and, in part, will be apparent from the description, or may be learned by practice of the presented exemplary embodiments.

According to an aspect of an exemplary embodiment, there is provided an image sensor in which a plurality of nanoantennas are arranged to satisfy a sub-wavelength condition, wherein each of the plurality of nanoantennas includes: a respective diode that includes a first conductive semiconductor layer and a second conductive semiconductor layer; and a respective transistor that includes a third conductive semiconductor layer that is in contact with the second conductive semiconductor layer, a gate electrode that is in contact with each of the third conductive semiconductor layer and the second conductive semiconductor layer, and a first conductive diffusion node that is in contact with the third conductive semiconductor layer and is not in contact with the second conductive semiconductor layer.

For each of the plurality of nanoantennas, the respective diode may include a PN diode in which the first conductive semiconductor layer is in contact with the second conductive semiconductor layer.

For each of the plurality of nanoantennas, the respective diode may include a PN diode that further includes an intrinsic semiconductor layer disposed between the first conductive semiconductor layer and the second conductive semiconductor layer.

The first conductive diffusion nodes of at least some of the plurality of nanoantennas may be electrically connected to one another.

At least some of the plurality of nanoantennas may respectively receive light having different wavelengths.

At least some of the plurality of nanoantennas may respectively receive light having the same wavelength.

For each of the plurality of nanoantennas, the respective gate electrode may penetrate the third conductive semiconductor layer and thus contact the second conductive semiconductor layer.

Each of the plurality of nanoantennas may further include a ground electrode that is in contact with the first conductive semiconductor layer.

The image sensor may further include trench isolations disposed between adjacent ones from among the plurality of nanoantennas such that the plurality of nanoantennas may not electrically interfere with one another.

The trench isolations may have a lower refractive index than each respective diode.

For each of the plurality of nanoantennas, the respective first conductive semiconductor layer may have a smaller cross-sectional area than the intrinsic semiconductor layer.

Intervals between adjacent ones from among the plurality of nanoantennas may be less than wavelengths of light received by the plurality of nanoantennas.

For each of the plurality of nanoantennas, each of the first conductive semiconductor layer, the intrinsic semiconductor layer, and the second conductive semiconductor layer may have any one of a cylindrical shape, an elliptical pillar shape, a regular hexahedron shape, a triangular prism shape, a square pillar shape, and a polyhedral column shape.

According to an aspect of another exemplary embodiment, an image sensor includes: a first nanoantenna that includes a first diode and a first transistor that is configured to facilitate a flow of a first current to a first diffusion node as a result of an application of a first gate voltage to an N-type region of the first diode; and a second nanoantenna that includes a second diode and a second transistor that is configured to facilitate a flow of a second current to a second diffusion node as a result of an application of a second gate voltage to an N-type region of the second diode, wherein each of the first nanoantenna and the second nanoantenna satisfies a sub-wavelength condition, and the first diffusion node and the second diffusion node are electrically connected to each other.

The first transistor may include a first P-type semiconductor layer that is in contact with the N-type region of the first diode, a first gate electrode that is in contact with each of the first P-type semiconductor layer and the N-type region of the first diode, and the first diffusion node that is not in contact with the N-type region of the first diode, but is in contact with the first P-type semiconductor layer, and the second transistor may include a second P-type semiconductor layer that is in contact with the N-type region of the second diode, a second gate electrode that is in contact with each of the second P-type semiconductor layer and the N-type region of the second diode, and the second diffusion node that is not in contact with the N-type region of the second diode, but is in contact with the second P-type semiconductor layer.

The first diode and the second diode may receive light having different wavelengths.

The first diode may be any one of a PN diode and a PIN diode, and the second diode may be any one of the PN diode and the PIN diode.

The first gate electrode may penetrate the first P-type semiconductor layer and thus contact the N-type region of the first diode, and the second gate electrode may penetrate the second P-type semiconductor layer and thus contact the N-type region of the second diode.

The image sensor may further include a ground electrode that is in contact with each of a P-type region of the first diode and a P-type region of the second diode.

The image sensor may further include a trench isolation disposed between the first nanoantenna and the second nanoantenna in a manner such that the first nanoantenna and the second nanoantenna may not electrically interfere with each other.

BRIEF DESCRIPTION OF THE DRAWINGS

These and/or other aspects will become apparent and more readily appreciated from the following description of exemplary embodiments, taken in conjunction with the accompanying drawings in which.

DETAILED DESCRIPTION

Figure 1:
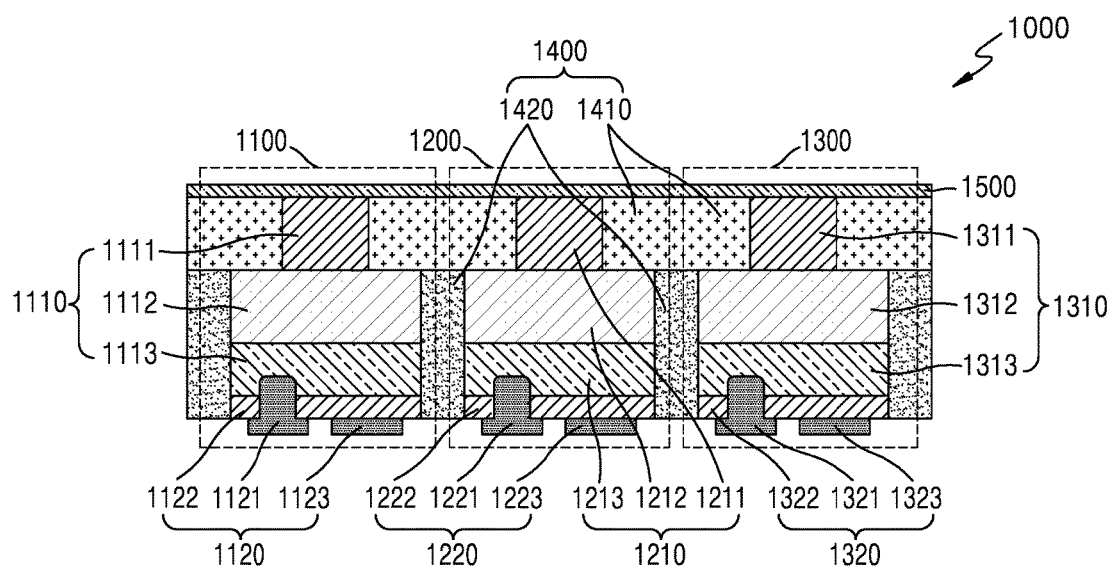
FIG. 1 is a schematic cross-sectional view of an image sensor, according to an exemplary embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects. Expressions such as "at least one of", when preceding a list of elements, modify the entire list of elements and do not modify the individual elements of the list.

An image sensor including nanoantennas will be described more fully with reference to the accompanying drawings, in which one or more exemplary embodiments are shown. Widths and thicknesses of layers or regions shown in the drawings are exaggerated for clarity and convenience of explanation. Like reference numerals in the drawings denote like elements, and thus their description will be omitted.

The terms used in this specification are those general terms currently widely used in the art in consideration of functions regarding the present disclosure, but the terms may vary according to the intention of those of ordinary skill in the art, precedents, or new technology in the art. In addition, specified terms may be selected by the applicant, and in this case, the detailed meaning thereof will be described in the detailed description of the present disclosure. Thus, the terms used in the specification should be understood not as simple names but based on the meaning of the terms and the overall description of the present disclosure.

While such terms as "first", "second", etc., may be used to describe various components, such components must not be limited to the above terms. The above terms are used only to distinguish one component from another.

As used herein, the singular forms "a", "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

Figure 2:
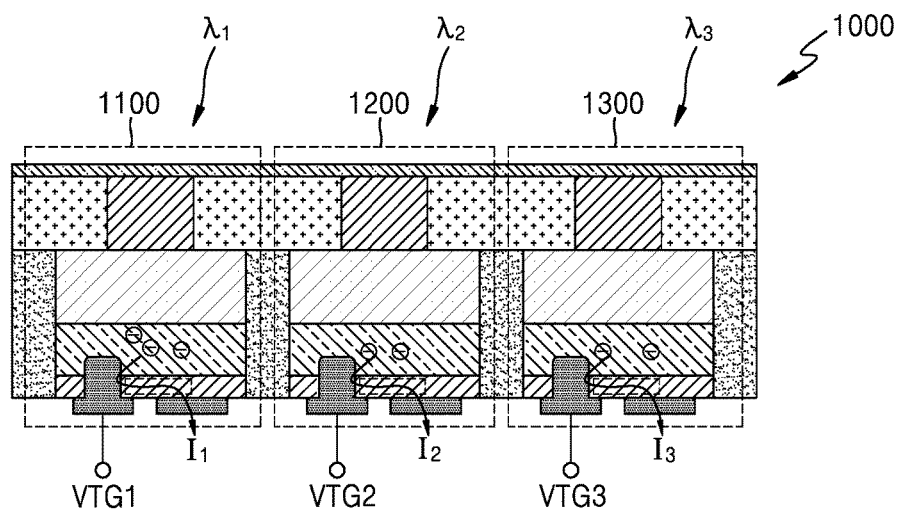
FIG. 2 is a schematic diagram showing an operation of the image sensor of FIG. 1.

FIG. 1 is a schematic cross-sectional view of an image sensor 1000, according to an exemplary embodiment. FIG. 2 is a schematic cross-sectional view showing an operation of the image sensor 1000 of FIG. 1.

Referring to FIGS. 1 and 2, the image sensor 1000 may include a plurality of nanoantennas.

The nanoantennas may include a first nanoantenna 1100, a second nanoantenna 1200, and a third nanoantenna 1300. The nanoantennas may be arranged to satisfy sub-wavelength conditions. For example, the first nanoantenna 1100, the second nanoantenna 1200, and the third nanoantenna 1300 may be spaced apart from one another at regular intervals, and the intervals may be less than respective wavelengths of light received by the first nanoantenna 1100, the second nanoantenna 1200, and the third nanoantenna 1300. For example, a height or a width of the first nanoantenna 1100 may be less than a wavelength of light received by the first nanoantenna 1100. Further, a height or a width of the second nanoantenna 1200 may be less than a wavelength of light received by the second nanoantenna 1200. Still further, a height or a width of the third nanoantenna 1300 may be less than a wavelength of light received by the third nanoantenna 1300. For convenience, the heights of the first nanoantenna 1100, the second nanoantenna 1200, and the third nanoantenna 1300 may be the same.

The first nanoantenna 1100 may include a first PIN diode 1110 and a first transistor 1120. The first nanoantenna 1100 may receive light having a first wavelength. A wavelength band of the light received by the first nanoantenna 1100 may be determined based on one or more of a height, a width, and a refractive index of the first nanoantenna 1100. For example, the first wavelength may vary based on one or more of a cross-sectional area, a height, and a shape of an intrinsic semiconductor layer 1112. For example, the first nanoantenna 1100 may receive any one of red light, blue light, and green light. However, the exemplary embodiments are not limited thereto.

The first PIN diode 1110 may include a first conductive semiconductor layer 1111, a second conductive semiconductor layer 1113, and the intrinsic semiconductor layer 1112. The first conductive semiconductor layer 1111 and the second conductive semiconductor layer 1113 may form a PN junction structure, and the intrinsic semiconductor layer 1112 may be disposed between the PN junction structure. For example, the first conductive semiconductor layer 1111 may be a P-type semiconductor layer, and the second conductive semiconductor layer 1113 may be an N-type semiconductor layer, or vice versa. Hereinafter, a case where the first conductive semiconductor layer 1111 is a P-type semiconductor layer and the second conductive semiconductor layer 1113 is an N-type semiconductor layer will be described.

When a PN diode is applied to the intrinsic semiconductor layer 1112, the intrinsic semiconductor layer 1112 may be a depletion layer. Incident light may be incident to the intrinsic semiconductor layer 1112, and thus electrons and holes may be generated. The holes may move to the first conductive semiconductor layer 1111 that is the P-type semiconductor layer, and the electrons may move to the second conductive semiconductor layer 1113 that is the N-type semiconductor layer.

The first conductive semiconductor layer 1111 may have a smaller cross-sectional area than the intrinsic semiconductor layer 1112 and the second conductive semiconductor layer 1113. For example, the intrinsic semiconductor layer 1112 and the second conductive semiconductor layer 1113 may have the same cross-sectional area, and the first conductive semiconductor layer 1111 may have a smaller cross-sectional area than the intrinsic semiconductor layer 1112 and the second conductive semiconductor layer 1113.

The first transistor 1120 may include a gate electrode 1121, a third conductive semiconductor layer 1122, and a diffusion node 1123. The gate electrode 1121 may be in contact with each of the second conductive semiconductor layer 1113 and the third conductive semiconductor layer 1122. For example, the gate electrode 1121 may penetrate the third conductive semiconductor layer 1122 and thus contact the second conductive semiconductor layer 1113. The third conductive semiconductor layer 1122 may be in contact with the second conductive semiconductor layer 1113. When a gate voltage is applied to the gate electrode 1121, the third conductive semiconductor layer 1122 may have a channel via which electrons stored in the second conductive semiconductor layer 1113 may flow to the diffusion node 1123. The diffusion node 1123 is in contact with the third conductive semiconductor layer 1122, but is not in contact with the second conductive semiconductor layer 1113. The third conductive semiconductor layer 1122 may be of the same conductivity type as the first conductive semiconductor layer 1111. For example, the third conductive semiconductor layer 1122 may have P-type conductivity.

The second nanoantenna 1200 may include a second PIN diode 1210 and a second transistor 1220. The second nanoantenna 1200 may receive light having a second wavelength. A wavelength band of the light received by the second nanoantenna 1200 may be determined based on one or more of a height, a width, and a refractive index thereof. For example, the second wavelength may vary based on one or more of a cross-sectional area, a height, and a shape of an intrinsic semiconductor layer 1212. For example, the second nanoantenna 1200 may receive any one of red light, blue light, and green light. However, the exemplary embodiments are not limited thereto. According to an exemplary embodiment, the second nanoantenna 1200 may receive light having a different wavelength from the first nanoantenna 1100. In this case, the second nanoantenna 1200 may have a height, a width, a refractive index, etc. which are different from those of the first nanoantenna 1100. As another example, the second nanoantenna 1200 may receive light having the same wavelength as the first nanoantenna 1100.

The second PIN diode 1210 may include a first conductive semiconductor layer 1211, a second conductive semiconductor layer 1213, and the intrinsic semiconductor layer 1212. The second transistor 1220 may include a gate electrode 1221, a third conductive semiconductor layer 1222, and a diffusion node 1223. The second PIN diode 1210 may have substantially the same structure as the first PIN diode 1110, and the second transistor 1220 may have substantially the same structure as the first transistor 1120 described above. Thus, repeated descriptions thereof are omitted.

The third nanoantenna 1300 may include a third PIN diode 1310 and a third transistor 1320. The third nanoantenna 1300 may receive light having a third wavelength. For example, the third nanoantenna 1300 may receive any one of red light, blue light, and green light. According to an exemplary embodiment, the third nanoantenna 1300 may receive light having a different wavelength from the first nanoantenna 1100 and the second nanoantenna 1200. In this case, the third nanoantenna 1300 may have a height, a width, a refractive index, etc. different from those of the first nanoantenna 1100. For example, the first nanoantenna 1100 may receive red light, the second nanoantenna 1200 may receive blue light, and the third nanoantenna 1300 may receive green light. According to another exemplary embodiment, the third nanoantenna 1300 may receive light having the same wavelength as the first nanoantenna 1100 and the second nanoantenna 1200.

The third PIN diode 1310 may include a first conductive semiconductor layer 1311, a second conductive semiconductor layer 1313, and an intrinsic semiconductor layer 1312. The third transistor 1320 may include a gate electrode 1321, a third conductive semiconductor layer 1322, and a diffusion node 1323. The third PIN diode 1310 may have substantially the same structure as the first PIN diode 1110, and the third transistor 1320 may have substantially the same structure as the first transistor 1120 described above. Thus, repeated descriptions thereof are omitted.

The nanoantennas may include respective semiconductors having high refractive indices. For example, at least one of the nanoantennas may include a material such as silicon (Si) or gallium arsenide (GaAs). Alternatively, at least one of the nanoantennas may include metal. For example, at least one of the nanoantennas may include a material such as aluminum (Al), titanium nitride (TiN), or silver (Ag). The nanoantennas including the aforementioned material may use a plasmonic effect. Alternatively, at least one of the nanoantennas may include a two-dimensional (2D) material. For example, at least one of the nanoantennas may include graphene. When nanoantenna structures and functions are embodied based on a plasmonic effect and 2D materials, a PIN diode structure formed as a separate semiconductor is disposed around the nanoantennas, and thus light captured by the nanoantennas undergoes photoelectric conversion.

Trench isolations 1400 may be disposed between adjacent ones of the nanoantennas. The trench isolations 1400 prevent electrical interference between the nanoantennas. For example, the trench isolations 1400 may be disposed between the first nanoantenna 1100 and the second nanoantenna 1200 and between the second nanoantenna 1200 and the third nanoantenna 1300. For example, the trench isolations 1400 may completely fill gaps between adjacent nanoantennas. The trench isolations 1400 may include first trench isolations 1410 and second trench isolations 1420. The first trench isolations 1410 may be disposed between the first conductive semiconductor layers 1111, 1211, and 1311, and the second trench isolations 1420 may be disposed between the intrinsic semiconductor layers 1112, 1212, and 1312, the second conductive semiconductor layers 1113, 1213, and 1313, and the third conductive semiconductor layers 1122, 1222, and 1322. The trench isolations 1400 may include a semiconductor material that has a relatively low refractive index. For example, the trench isolation 1400 may include any one of silicon oxide ($SiO_2$), a polymer, or the like. For example, the trench isolation 1400 may include a material that has a lower refractive index than the nanoantennas. As a difference between the refractive indices of the nanoantennas and the refractive indices of the trench isolations 1400 increases, the efficiency of photoelectric conversion and wavelength separation may correspondingly increase.

The first trench isolations 1410 and the second trench isolations 1420 may include the same material or different materials. While the image sensor 1000 according to the present exemplary embodiment is manufactured, the second trench isolations 1420 may be formed before the first trench isolations 1410 are formed.

A ground electrode 1500 may be in contact with the nanoantennas. For example, the ground electrode 1500 may be in contact with each of the first conductive semiconductor layer 1111 of the first nanoantenna 1100, the first conductive semiconductor layer 1211 of the second nanoantenna 1200, and the first conductive semiconductor layer 1311 of the third nanoantenna 1300. Referring to FIG. 1, the ground electrode 1500 may function as a common ground electrode for the nanoantennas. However, the exemplary embodiments are not limited thereto, and the ground electrode 1500 may include a plurality of ground electrodes for respectively grounding the nanoantennas. The ground electrode 1500 may include a metallic material that has a relatively high electric conductivity. Alternatively, the ground electrode 1500 may include graphene or a transparent conductive metal oxide such as indium tin oxide (ITO), indium zinc oxide (IZO), aluminum zinc oxide (AZO), or gallium zinc oxide (GZO).

Referring to FIG. 2, the first nanoantenna 1100 may receive the light having the first wavelength, the second nanoantenna 1200 may receive the light having the second wavelength, and the third nanoantenna 1300 may receive the light having the third wavelength. The nanoantennas may respectively correspond to pixels.

The light having the first wavelength that is incident to the first nanoantenna 1100 may be received by the intrinsic semiconductor layer 1112 of the first PIN diode 1110. The intrinsic semiconductor layer 1112 may generate electrons and holes. The holes may move to the first conductive semiconductor layer 1111 that is a P-type semiconductor layer, and the electrons may move to the second conductive semiconductor layer 1113 that is an N-type semiconductor layer. Based on the intensity of the light having the first wavelength, the quantity of electrons stored in the second conductive semiconductor layer 1113 may correspondingly vary.

The gate electrode 1121 may apply a gate voltage VTG1 to the first PIN diode 1110 in order to determine the quantity of electrons stored in the second conductive semiconductor layer 1113. For example, the gate electrode 1121 may apply a predetermined level of the gate voltage VTG1 to the second conductive semiconductor layer 1113 in order to form a channel in the third conductive semiconductor layer 1122 and may enable the electrons stored in the second conductive semiconductor layer 1113 to flow to the diffusion node 1123 via the channel. For example, a current $I_1$ may flow to the diffusion node 1123. The current $I_1$ may be output via a particular circuit, e.g., a posterior circuit portion (not shown). The intensity of the light received by the first nanoantenna 1100 may be measured by reading an amplitude of the current $I_1$ flowing out of the diffusion node 1123.

The second nanoantenna 1200 and the third nanoantenna 1300 operate in substantially the same manner as the above-described first nanoantenna 1100, and thus repeated descriptions thereof are omitted. When a gate voltage VTG2 is applied to the gate electrode 1221, a current $I_2$ may flow out of the diffusion node 1223 of the second nanoantenna 1200. When a gate voltage VGT3 is applied to the gate electrode 1321, a current $I_3$ may flow out of the diffusion node 1323 of the third nanoantenna 1300. For example, the currents $I_1$ to $I_3$ from the first nanoantenna 1100, the second nanoantenna 1200, and the third nanoantenna 1300 may be processed by the same circuit. For example, the currents $I_1$ to $I_3$ from the first nanoantenna 1100, the second nanoantenna 1200, and the third nanoantenna 1300 may be processed by the same posterior circuit portion. Since the diffusion nodes 1123, 1223, and 1323 of the first nanoantenna 1100, the second nanoantenna 1200, and the third nanoantenna 1300 are electrically connected to one another, a circuit, e.g., a source-follower or an amplifier, which is disposed after the diffusion nodes 1123, 1223, and 1323, may not be included in each of the first nanoantenna 1100, the second nanoantenna 1200, and the third nanoantenna 1300. Thus, it may be relatively easy to miniaturize the image sensor 1000 according to the present exemplary embodiment.

Figure 3:
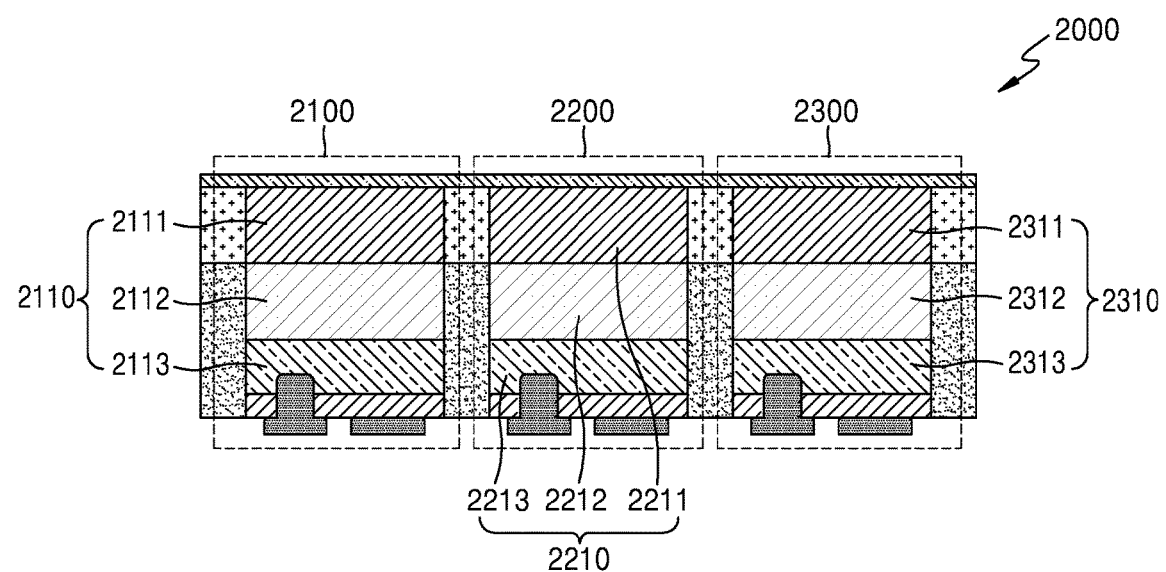
FIG. 3 is a schematic diagram of an image sensor, according to another exemplary embodiment.

FIG. 3 is a schematic diagram of an image sensor 2000, according to another exemplary embodiment. Referring to FIG. 3, the image sensor 2000 may include a first nanoantenna 2100, a second nanoantenna 2200, and a third nanoantenna 2300.

The first nanoantenna 2100 may include a first PIN diode 2110. The first PIN diode 2110 may include a first conductive semiconductor layer 2111, a second conductive semiconductor layer 2113, and an intrinsic semiconductor layer 2112. For example, the first conductive semiconductor layer 2110, the second conductive semiconductor layer 2113, and the intrinsic semiconductor layer 2112 may have the same shape and the same cross-sectional area. The second nanoantenna 2200 may include a first conductive semiconductor layer 2211, a second conductive semiconductor layer 2213, and an intrinsic semiconductor layer 2212, all of which have the same shape and the same cross-sectional area. The third nanoantenna 2300 may include a first conductive semiconductor layer 2311, a second conductive semiconductor layer 2313, and an intrinsic semiconductor layer 2312, all of which have the same shape and the same cross-sectional area.

Figure 4:
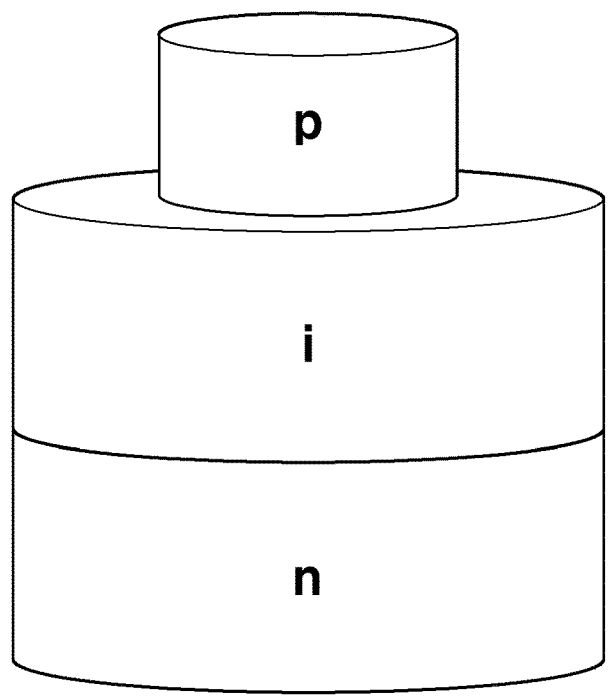
FIG. 4 is a schematic perspective view of a PIN diode, according to an exemplary embodiment.
Figure 5:
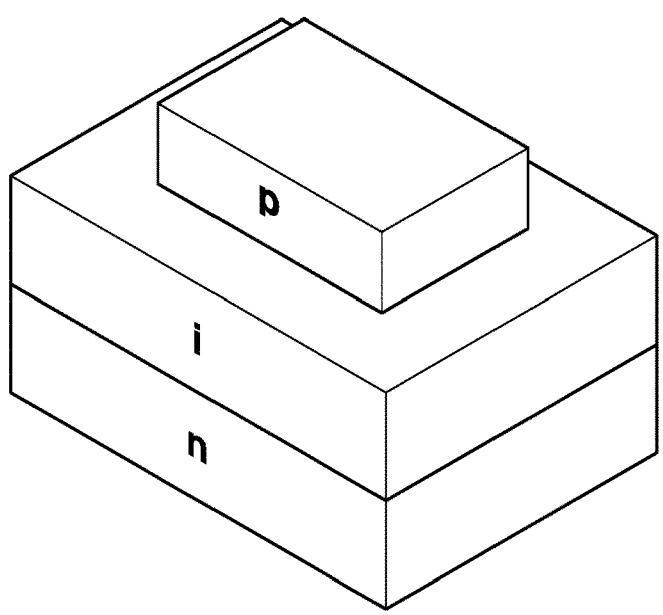
FIG. 5 is a schematic perspective view of a PIN diode, according to another exemplary embodiment.

FIG. 4 is a schematic perspective view of a PIN diode, according to an exemplary embodiment. FIG. 5 is a schematic perspective view of a PIN diode, according to another exemplary embodiment.

Each of a first conductive semiconductor layer (e.g., a P-type region layer), a second conductive semiconductor layer (e.g., an N-type region layer), and an intrinsic semiconductor layer (e.g., a depletion layer) forming the PIN diode may have any one of a cylindrical shape, an elliptical pillar shape, a regular hexahedron shape, a triangular prism shape, a square pillar shape, and a polyhedral column shape.

Referring to FIG. 4, each of the first conductive semiconductor layer (i.e., the P-type region layer), the second conductive semiconductor layer (i.e., the N-type region layer), and the intrinsic semiconductor layer (i.e., the depletion layer) may have a cylindrical shape. FIG. 4 shows that the first conductive semiconductor layer has a smaller cross-sectional area than the second conductive semiconductor layer (the N-type region layer) and the intrinsic semiconductor layer (the depletion layer). However, the exemplary embodiments are not limited thereto.

Referring to FIG. 5, the first conductive semiconductor layer (i.e., the P-type region layer), the second conductive semiconductor layer (i.e., the N-type region layer), and the intrinsic semiconductor layer (i.e., the depletion layer) may each have a regular hexahedron shape. FIG. 5 shows that the first conductive semiconductor layer has a smaller cross-sectional area than the second conductive semiconductor layer (the N-type region layer) and the intrinsic semiconductor layer (the depletion layer). However, the exemplary embodiments are not limited thereto.

Figure 6:
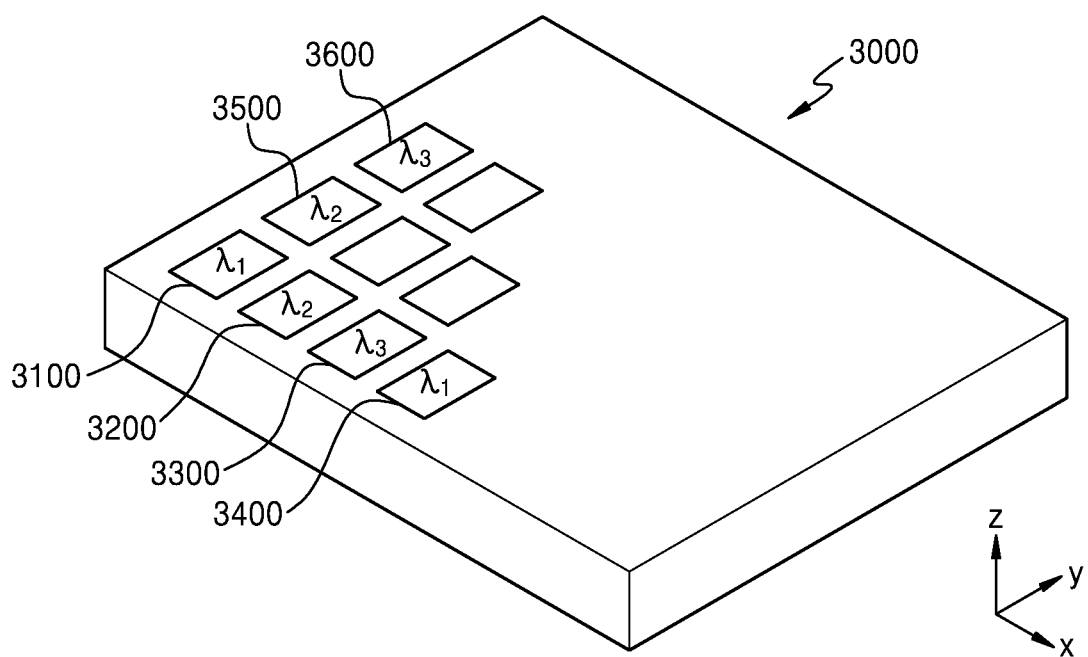
FIG. 6 is a schematic perspective view of an image sensor, according to another exemplary embodiment.

FIG. 6 is a schematic perspective view of an image sensor 3000, according to another exemplary embodiment. Referring to FIG. 6, the nanoantennas may be arranged in a two-dimensional (2D) array. The nanoantennas may include first nanoantennas 3100 and 3400, second nanoantennas 3200 and 3500, and third nanoantennas 3300 and 3600. The nanoantennas may respectively correspond to pixels.

The first nanoantennas 3100 and 3400 receive light having a first wavelength, the second nanoantennas 3200 and 3500 receive light having a second wavelength, and the third nanoantennas 3300 and 3600 receive light having a third wavelength. The light having the first wavelength may be, for example, any one of red light, blue light, and green light. The light having the second wavelength may be, for example, any one of red light, blue light, and green light. The light having the third wavelength may be, for example, any one of red light, blue light, and green light. However, the exemplary embodiments are not limited thereto. Various types and the number of light may be sensed according to necessity. For example, the nanoantennas may respectively sense light of four different colors. As another example, the nanoantennas may sense light of two or more colors.

The nanoantennas may be arranged on an x-y plane at regular spacing intervals. For example, the first nanoantenna 3100, the second nanoantenna 3200, and the third nanoantenna 3300 may be periodically spaced apart from one another in an x direction. For example, the first nanoantenna 3100, the second nanoantenna 3500, and the third nanoantenna 3600 may be periodically spaced apart from one another in a y direction. However, this is merely an example, and the exemplary embodiments are not limited thereto.

Figure 7:
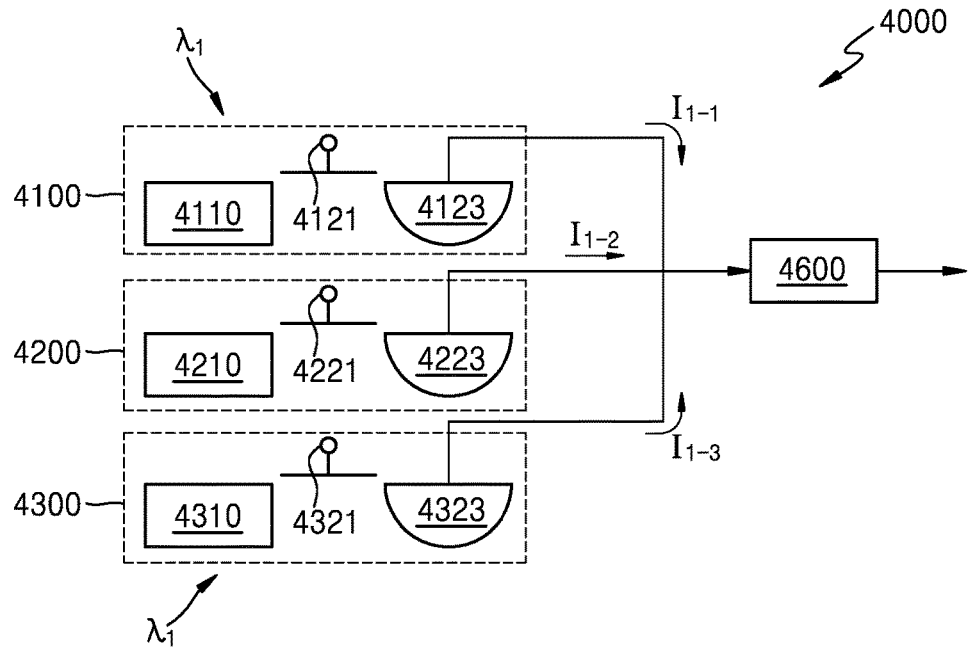
FIG. 7 is a schematic circuit diagram of an image sensor, according to another exemplary embodiment.

FIG. 7 is a schematic circuit diagram of an image sensor 4000, according to another exemplary embodiment. Referring to FIG. 7, each of a first nanoantenna 4100, a second nanoantenna 4200, and a third nanoantenna 4300 may receive light identically having the first wavelength. Although FIG. 7 shows three nanoantennas for convenience, the exemplary embodiments are not limited thereto.

In proportion to the intensity of the light having the first wavelength and received by the first nanoantenna 4100, electrons accumulated in a PIN diode 4110 may flow to a diffusion node 4123 as a result of a gate voltage that is applied to a gate electrode 4121. A current flowing to the diffusion node 4123 is referred to as a current $I_{1-1}$. Amplitude of the current $I_{1-1}$ indicates the intensity of the light received by the first nanoantenna 4100. In proportion to the intensity of the light having the second wavelength and received by the second nanoantenna 4200, electrons accumulated in a PIN diode 4210 may flow to a diffusion node 4223 as a result of a gate voltage that is applied to a gate electrode 4221. A current flowing to the diffusion node 4223 is referred to as a current $I_{1-2}$. Amplitude of the current $I_{1-2}$ indicates the intensity of the light received by the second nanoantenna 4200. In proportion to the intensity of the light having the third wavelength and received by the third nanoantenna 4300, electrons accumulated in a PIN diode 4310 may flow to a diffusion node 4323 as a result of a gate voltage that is applied to a gate electrode 4321. A current flowing to the diffusion node 4323 is referred to as a current $I_{1-3}$. Amplitude of the current $I_{1-3}$ indicates the intensity of the light received by the third nanoantenna 4300.

In the image sensor 4000 according to the present exemplary embodiment, the diffusion nodes 4123, 4223, and 4323 may be electrically connected to one another. Thus, the currents $I_{1-1}$, $I_{1-2}$, and $I_{1-3}$ may flow in the same circuit. A posterior circuit portion 4600 may be electrically connected to each of the diffusion nodes 4123, 4223, and 4323. The posterior circuit portion 4600 variably controls short-circuit periods of the gate electrodes 4121, 4221, and 4321 of the first, second, and third nanoantennas 4100, 4200, and 4300, and thus the currents $I_{1-1}$, $I_{1-2}$, and $I_{1-3}$ respectively from the diffusion nodes 4123, 4223, and 4323 may be separated by time periods and output. For example, the posterior circuit portion 4600 may separately output the currents $I_{1-1}$, $I_{1-2}$, and $I_{1-3}$ in each respective time frame.

In the image sensor 4000 according to the present exemplary embodiment, one posterior circuit portion 4600 and a circuit wire correspond to the first, second, and third nanoantennas 4100, 4200, and 4300, and thus a circuit structure may be simplified.

Figure 8:
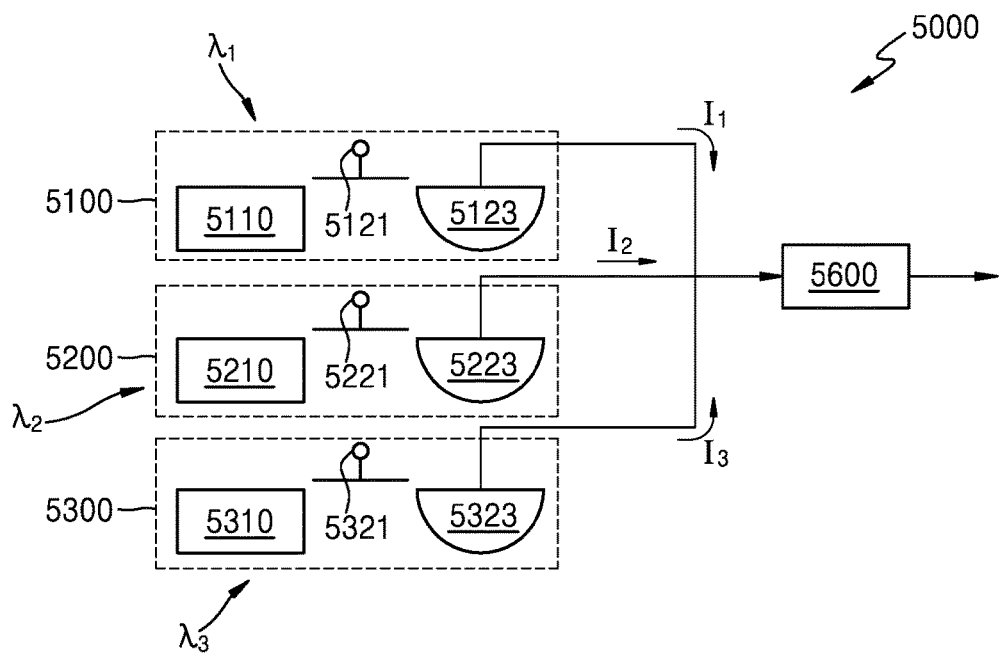
FIG. 8 is a schematic circuit diagram of an image sensor, according to another exemplary embodiment.

FIG. 8 is a schematic circuit diagram of an image sensor 5000, according to another exemplary embodiment. Referring to FIG. 8, a first nanoantenna 5100 may receive light having a first wavelength, a second nanoantenna 5200 may receive light having a second wavelength, and a third nanoantenna 5300 may receive light having a third wavelength. Although FIG. 8 shows three nanoantennas for convenience, the exemplary embodiments are not limited thereto.

In proportion to the intensity of the light having the first wavelength and received by the first nanoantenna 5100, electrons accumulated in a PIN diode 5110 may flow to a diffusion node 5123 as a result of a gate voltage that is applied to a gate electrode 5121. A current flowing to the diffusion node 5123 is referred to as a current $I_1$. In proportion to the intensity of the light having the second wavelength and received by the second nanoantenna 5200, electrons accumulated in a PIN diode 5210 may flow to a diffusion node 5223 as a result of a gate voltage that is applied to a gate electrode 5221. A current flowing to the diffusion node 5223 is referred to as a current $I_2$. In proportion to the intensity of the light having the third wavelength and received by the third nanoantenna 5300, electrons accumulated in a PIN diode 5310 may flow to a diffusion node 5323 as a result of a gate voltage that is applied to a gate electrode 5321. A current flowing to the diffusion node 5323 is referred to as a current $I_3$.

In the image sensor 5000 according to the present exemplary embodiment, the diffusion nodes 5123, 5223, and 5323 may be electrically connected to one another. Thus, the currents $I_1$, $I_2$, and $I_3$ may flow in the same circuit.

A posterior circuit portion 5600 may be electrically connected to each of the diffusion nodes 5123, 5223, and 5323. The posterior circuit portion 5600 may control a gating period of each of the nanoantennas and thus may separate the currents $I_1$, $I_2$, and $I_3$ respectively transmitted from the diffusion nodes 5123, 5223, and 5323 from temporal regions and output the currents $I_1$, $I_2$, and $I_3$. In this aspect, the posterior circuit portion 5600 may separately output the currents $I_1$, $I_2$, and $I_3$ in each respective time frame.

In the image sensor 5000 according to the present exemplary embodiment, one posterior circuit portion 5600 and a circuit wire correspond to the first, second, and third nanoantennas 5100, 5200, and 5300, and thus a circuit structure may be simplified.

Figure 9:
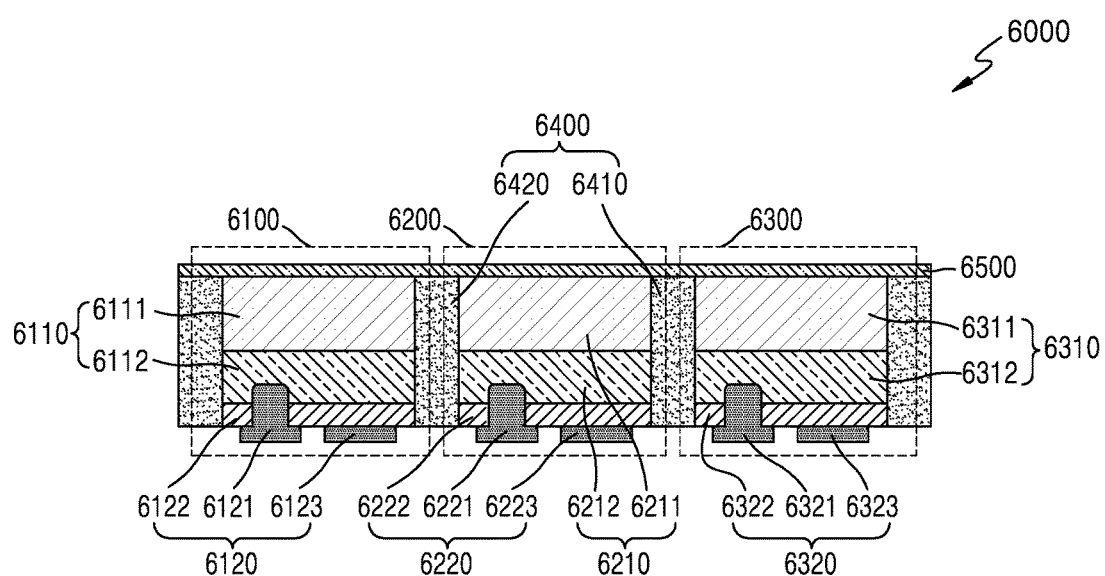
FIG. 9 is a schematic cross-sectional view of an image sensor, according to another exemplary embodiment.

FIG. 9 is a schematic cross-sectional view of an image sensor 6000, according to another exemplary embodiment. Referring to FIG. 9, the nanoantennas may include a first nanoantenna 6100, a second nanoantenna 6200, and a third nanoantenna 6300. The nanoantennas 6100, 6200, and 6300 may be arranged to satisfy sub-wavelength conditions.

The first nanoantenna 6100 may include a first PN diode 6110 and a first transistor 6120. The first PN diode 6110 may include a first conductive semiconductor layer 6111 and a second conductive semiconductor layer 6112. The first conductive semiconductor layer 6111 and the second conductive semiconductor layer 6112 may form a PN junction structure. The first conductive semiconductor layer 6111 may have P-type conductivity, and the second conductive semiconductor layer 6112 may have N-type conductivity.

The first transistor 6120 may include a gate electrode 6121, a third conductive semiconductor layer 6122, and a diffusion node 6123. The gate electrode 6121 may be in contact with each of the second conductive semiconductor layer 6112 and the third conductive semiconductor layer 6122. For example, the gate electrode 6121 may penetrate the third conductive semiconductor layer 6122 and thus may contact the second conductive semiconductor layer 6112. The third conductive semiconductor layer 6122 may be in contact with the second conductive semiconductor layer 6112. When a gate voltage is applied to the gate electrode 6121, the third conductive semiconductor layer 6122 may have a channel via which electrons stored in the second conductive semiconductor layer 6112 flow to the diffusion node 6123. The diffusion node 6123 may be in contact with the third conductive semiconductor layer 6122, but may not be in contact with the second conductive semiconductor layer 6112. The third conductive semiconductor layer 6122 may have the same conductivity as the first conductive semiconductor layer 6111. For example, the third conductive semiconductor layer 6122 may have P-type conductivity.

The second nanoantenna 6200 may include a second PN diode 6210 and a second transistor 6220. The second PN diode 6210 may include a first conductive semiconductor layer 6211 and a second conductive semiconductor layer 6212. The first conductive semiconductor layer 6211 and the second conductive semiconductor layer 6212 may form a PN junction structure. The second transistor 6220 may include a gate electrode 6221, a third conductive semiconductor layer 6222, and a diffusion node 6223. The third nanoantenna 6300 may include a third PN diode 6310 and a third transistor 6320. The third PN diode 6310 may include a first conductive semiconductor layer 6311 and a second conductive semiconductor layer 6312. The first conductive semiconductor layer 6311 and the second conductive semiconductor layer 6312 may form a PN junction structure. The third transistor 6320 may include a gate electrode 6321, a third conductive semiconductor layer 6322, and a diffusion node 6323. Trench isolations 6400 may be disposed between adjacent ones of the nanoantennas 6100, 6200, and 6300. The trench isolations 6400 may include a first trench isolation 6410 and a second trench isolation 6420. A ground electrode 6500 may function as a common ground electrode for the first conductive semiconductor layers 6111, 6211, and 6311.

The image sensor 6000 according to the present exemplary embodiment includes a PIN photodiode or a transistor structure on a lower portion of the PN photodiode and thus may be miniaturized.

Diffusion nodes of nanoantennas may be electrically connected to one another, the diffusion node being the node to which currents flow. Thus, a circuit may be miniaturized as an image sensor is miniaturized. As the diffusion nodes of the nanoantennas, which receive different wavelengths of incident light, are electrically connected to one another, a common circuit disposed after the diffusion nodes may process input signals having various wavelengths. In this aspect, the diffusion nodes of the nanoantennas, which receive the same wavelength, are electrically connected to one another, and a posterior circuit may process input signals from various pixels in a time-sharing manner.

It should be understood that an image sensor that includes nanoantennas as described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. An image sensor in which a plurality of nanoantennas are arranged so as to satisfy a sub-wavelength condition, wherein each of the plurality of nanoantennas comprises:
    a respective diode comprising a first conductive semiconductor layer and a second conductive semiconductor layer; and
    a respective transistor comprising a third conductive semiconductor layer that is in contact with the second conductive semiconductor layer, a gate electrode that is in contact with each of the third conductive semiconductor layer and the second conductive semiconductor layer, and a diffusion node that is in contact with the third conductive semiconductor layer and is not in contact with the second conductive semiconductor layer,
    wherein the respective diode is disposed on a first surface of the third conductive semiconductor layer and the diffusion node is disposed on a second surface of the third conductive semiconductor which opposes the first surface of the third conductive semiconductor.

2. The image sensor of claim 1, wherein for each of the plurality of nanoantennas, the respective diode comprises a PN diode in which the first conductive semiconductor layer is in contact with the second conductive semiconductor layer.

3. The image sensor of claim 2, wherein at least a first one from among the plurality of nanoantennas is configured to receive light having a first wavelength and at least a second one from among the plurality of nanoantennas is configured to receive light having a second wavelength that is different from the first wavelength.

4. The image sensor of claim 1, wherein each of the plurality of nanoantennas further comprises a respective ground electrode that is in contact with the first conductive semiconductor layer.

5. The image sensor of claim 1, wherein for each of the plurality of nanoantennas, the respective diode comprises a PN diode that further comprises an intrinsic semiconductor layer disposed between the first conductive semiconductor layer and the second conductive semiconductor layer.

6. The image sensor of claim 1, wherein the diffusion node of at least a first one from among the plurality of nanoantennas is electrically connected to the diffusion node of at least a second one from among the plurality of nanoantennas.

7. The image sensor of claim 1, further comprising a plurality of trench isolations disposed between adjacent ones from among the plurality of nanoantennas such that the plurality of nanoantennas do not electrically interfere with one another.

8. The image sensor of claim 7, wherein each of the plurality of trench isolations has a lower refractive index than each respective diode.

9. The image sensor of claim 5, wherein for each of the plurality of nanoantennas, the first conductive semiconductor layer has a cross-sectional area that is smaller than the intrinsic semiconductor layer.

10. The image sensor of claim 1, wherein each interval between adjacent ones from among the plurality of nanoantennas is less than a minimum wavelength of light received by the plurality of nanoantennas.

11. The image sensor of claim 1, wherein the diffusion node extends in a direction heading away from the first surface and the second surface of the third conductive semiconductor.

12. The image sensor of claim 5, wherein for each of the plurality of nanoantennas, each of the first conductive semiconductor layer, the intrinsic semiconductor layer, and the second conductive semiconductor layer has one from among a cylindrical shape, an elliptical pillar shape, a regular hexahedron shape, a triangular prism shape, a square pillar shape, and a polyhedral column shape.

13. The image sensor of claim 1, wherein for each of the plurality of nanoantennas, the gate electrode penetrates through the third conductive semiconductor layer and protrudes from the first surface of the third conductive semiconductor.

14. An image sensor comprising:
a first nanoantenna comprising a first diode and a first transistor that is configured to facilitate a flow of a first current to a first diffusion node as a result of an application of a first gate voltage to an N-type region of the first diode; and
a second nanoantenna comprising a second diode and a second transistor that is configured to facilitate a flow of a second current to a second diffusion node as a result of an application of a second gate voltage to an N-type region of the second diode,
wherein the first diffusion node is electrically connected to the second diffusion node, and
wherein the first diode is disposed on a first surface of the first transistor and the first diffusion node is disposed on a second surface of the first transistor which opposes the first surface of the first transistor.

15. The image sensor of claim 14, wherein the first transistor comprises a first P-type semiconductor layer that is in contact with the N-type region of the first diode, a first gate electrode that is in contact with each of the first P-type semiconductor layer and the N-type region of the first diode, and the first diffusion node that is not in contact with the N-type region of the first diode, but is in contact with the first P-type semiconductor layer, and
the second transistor comprises a second P-type semiconductor layer that is in contact with the N-type region of the second diode, a second gate electrode that is in contact with each of the second P-type semiconductor layer and the N-type region of the second diode, and the second diffusion node that is not in contact with the N-type region of the second diode, but is in contact with the second P-type semiconductor layer.

16. The image sensor of claim 14, wherein the first diode includes one from among a first PN diode and a first PIN diode, and
the second diode includes one from among a second PN diode and a second PIN diode.

17. The image sensor of claim 15, wherein the first gate electrode penetrates the first P-type semiconductor layer, and
the second gate electrode penetrates the second P-type semiconductor layer.

18. The image sensor of claim 14, wherein the first diode is configured to receive light having a first wavelength, and the second diode is configured to receive light having a second wavelength that is different from the first wavelength.

19. The image sensor of claim 14, further comprising a ground electrode that is in contact with each of a P-type region of the first diode and a P-type region of the second diode.

20. The image sensor of claim 14, further comprising a trench isolation disposed between the first nanoantenna and the second nanoantenna such that the first nanoantenna and the second nanoantenna do not electrically interfere with each other.

* * * * *